(12) United States Patent
Akimoto (10) Patent No.: US 10,475,863 B2
(45) Date of Patent: Nov. 12, 2019

(54) DISPLAY DEVICE WITH INTEGRATED PHOTODIODE ARRAY

(71) Applicant: Japan Display Inc., Minato-ku (JP)

(72) Inventor: Hajime Akimoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/859,917

(22) Filed: Jan. 2, 2018

(65) Prior Publication Data
US 2018/0204890 A1  Jul. 19, 2018

(30) Foreign Application Priority Data
Jan. 17, 2017  (JP) ................................. 2017-005747

(51) Int. Cl.
| H01L 27/32 | (2006.01) |
|---|---|
| H01L 51/00 | (2006.01) |
| H01L 51/52 | (2006.01) |
| G06K 9/00 | (2006.01) |
| H01L 27/12 | (2006.01) |

(52) U.S. Cl.
CPC ...... H01L 27/3234 (2013.01); G06K 9/00255 (2013.01); G06K 9/00288 (2013.01); H01L 27/3262 (2013.01); H01L 51/0097 (2013.01); H01L 51/5218 (2013.01); H01L 27/1214 (2013.01); H01L 2251/5315 (2013.01); H01L 2251/5338 (2013.01)

(58) Field of Classification Search
CPC . H01L 27/3234; H01L 27/146; H01L 27/148; H01L 27/32
See application file for complete search history.

(56) References Cited

U.S. PATENT DOCUMENTS

| 6,392,617 | B1* | 5/2002 | Gleason | G09G 3/3233 345/207 |
|---|---|---|---|---|
| 10,176,355 | B2* | 1/2019 | Smith | G06K 9/0008 |
| 2009/0244678 | A1* | 10/2009 | Hagood, IV | G02B 26/02 359/230 |
| 2010/0067757 | A1* | 3/2010 | Arai | G06K 9/0004 382/128 |
| 2014/0046004 | A1* | 2/2014 | Matsumori | G02F 1/133723 525/432 |
| 2014/0232962 | A1 | 8/2014 | Ishida et al. | |
| 2015/0249119 | A1* | 9/2015 | In | H01L 27/3269 257/40 |
| 2015/0331508 | A1* | 11/2015 | Nho | G06F 3/0421 345/173 |

(Continued)

FOREIGN PATENT DOCUMENTS

JP    2014-160603    9/2014

*Primary Examiner* — Victoria K. Hall
(74) *Attorney, Agent, or Firm* — Oblon, McClelland, Maier & Neustadt, L.L.P.

(57) ABSTRACT

A sheet display includes a display region including a plurality of pixels arranged in a matrix and photodiodes arranged on regions not overlapped with the plurality of pixels in the matrix; and a laminated structure including at least a metal layer and provided on the photodiode, in which in at least two layers including the metal layer in the laminated structure, slits or holes are provided such that external light is incident on the photodiode, and a slit or a hole formed on one of the at least two layers and a slit or a hole formed on another of the at least two layers are provided by being overlapped with each other.

7 Claims, 13 Drawing Sheets

(56) References Cited

U.S. PATENT DOCUMENTS

| | | | | |
|---|---|---|---|---|
| 2016/0313793 A1* | 10/2016 | Hong | ................ | G06F 3/016 |
| 2017/0103248 A1* | 4/2017 | Yamamoto | ................ | G06F 1/00 |
| 2017/0161543 A1* | 6/2017 | Smith | ................ | G06K 9/0008 |
| 2017/0220838 A1* | 8/2017 | He | ................ | G06K 9/0004 |
| 2017/0220844 A1* | 8/2017 | Jones | ................ | G06K 9/0053 |

* cited by examiner

DISPLAY DEVICE WITH INTEGRATED PHOTODIODE ARRAY

CROSS-REFERENCE TO RELATED APPLICATION

The present application claims priority from Japanese application JP 2017-005747 filed on Jan. 17, 2017, the content of which is hereby incorporated by reference into this application.

BACKGROUND OF THE INVENTION

1. Field of the Invention

The present invention relates to a display device.

2. Description of the Related Art

Conventionally, there has been known a sheet shape display device having flexibility (for example, JP 2014-160603A).

Here, a display device in which an imaging unit such as a lens for capturing an external subject such as self-imaging as image data is mounted is known. In the display device of a sheet shape, there is also a demand to have an imaging function. However, it is difficult to mount a thick lens or the like on a thinned display device of the sheet shape.

SUMMARY OF THE INVENTION

An object of the present invention is to provide a display device which can deal with an external subject as image data and realize thinning thereof.

The display device of an aspect of the present invention includes a display region including a plurality of pixels arranged in a matrix and photodiodes arranged on regions not overlapped with the plurality of pixels in the matrix; and a laminated structure including at least a metal layer and provided on the photodiode, in which in at least two layers including the metal layer in the laminated structure, slits or holes are provided such that external light is incident on the photodiode, and a slit or a hole formed on one of the at least two layers and a slit or a hole formed on another of the at least two layers are provided by being overlapped with each other.

DETAILED DESCRIPTION OF THE INVENTION

Hereinafter, an embodiment of the present invention will be described with reference to the drawings. However, the present invention can be performed in various embodiments without departing from the gist thereof, and is not to be construed as being limited to the description contents of the embodiments exemplified below.

In order to clarify the explanation more clearly, the drawings may be schematically represented as width, thickness, shape, and the like of each unit as compared with an actual form, but it is only an example, and the interpretation of the present invention is not limited thereto. In this specification and each figure, the same reference numerals are attached to the elements having the same functions as those described with reference to the preceding figures, and redundant explanation may be omitted.

Furthermore, in the detailed description of the embodiment of the present invention, when defining a positional relationship between a certain constituent and another constituent, "above" or "below" means not only when it is located immediately above or below a certain constituent, but also further includes a case of interposing other constituent elements therebetween, unless otherwise specified.

Figure 1:
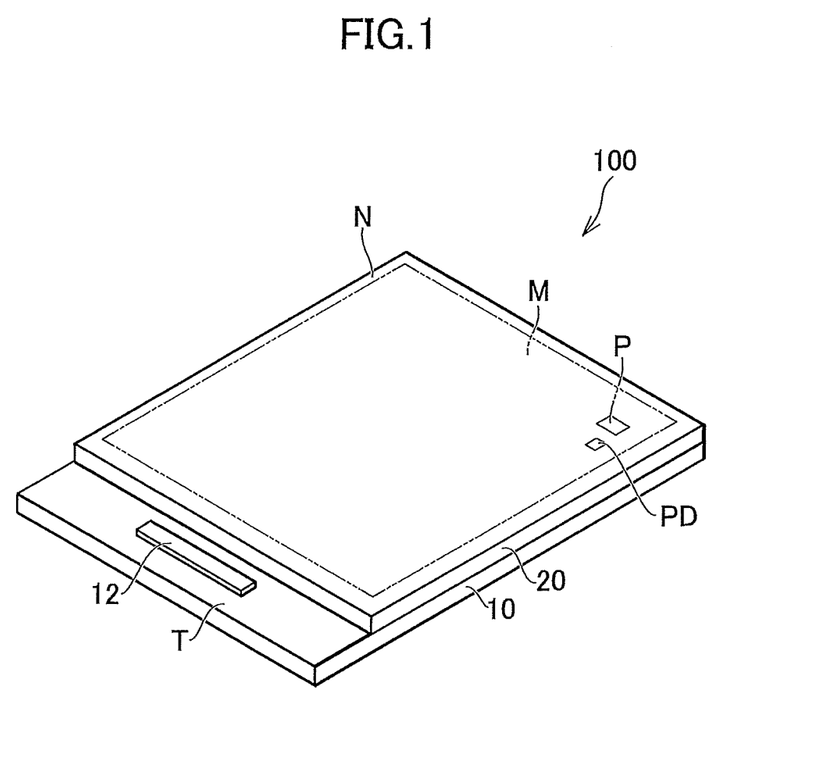
FIG. 1 is a perspective view schematically illustrating the entire configuration of a sheet display according to a first embodiment.

FIG. 1 is a perspective view schematically illustrating the entire configuration of the sheet display according to the embodiment. In the embodiment, an example of an organic electroluminescence sheet display is exemplified as a sheet display 100. For example, the sheet display 100 includes the pixels P of a plurality of colors of red, green, and blue, and displays a full-color image. In the following description, in a case where it is necessary to explain each color pixel distinctly, a symbol R indicating a pixel of red, a symbol G indicating a pixel of green, and a symbol B indicating a pixel of blue are added to a symbol P indicating a pixel, but in a case where it is unnecessary to explain distinctly, it is simply referred to as the pixel P.

The sheet display 100 includes a first substrate 10 and a second substrate 20 disposed to face the first substrate 10. The first substrate 10 includes a display region M in which a plurality of the pixels P are arranged in a matrix. In addition, the first substrate 10 includes a photodiode PD disposed in the matrix on a region not overlapped with the pixel P. In FIG. 1, only one pixel P and one photodiode PD are illustrated. However, the pixel P and the photodiode PD are arranged on the entire region of the display region M. The sheet display 100 receives an external light by the photodiode PD and converts the received light into an electric signal such that an external subject is obtained as image data and the obtained data is displayed on the display region M. As described above, in the present embodiment, an image obtaining method using so-called compound eye data is adopted in which the image data is obtained by providing a photodiode array.

In the embodiment, the display region M has flexibility, and can be curved. In addition, the first substrate 10 includes a frame region N in the vicinity of the display region M. Furthermore, the first substrate 10 has a terminal region T and an integrated circuit chip 12 for driving an element to display an image is mounted on the terminal region T. Although it is not illustrated, a flexible substrate for electrically connecting with the outside may be connected to the terminal region T.

Figure 2:
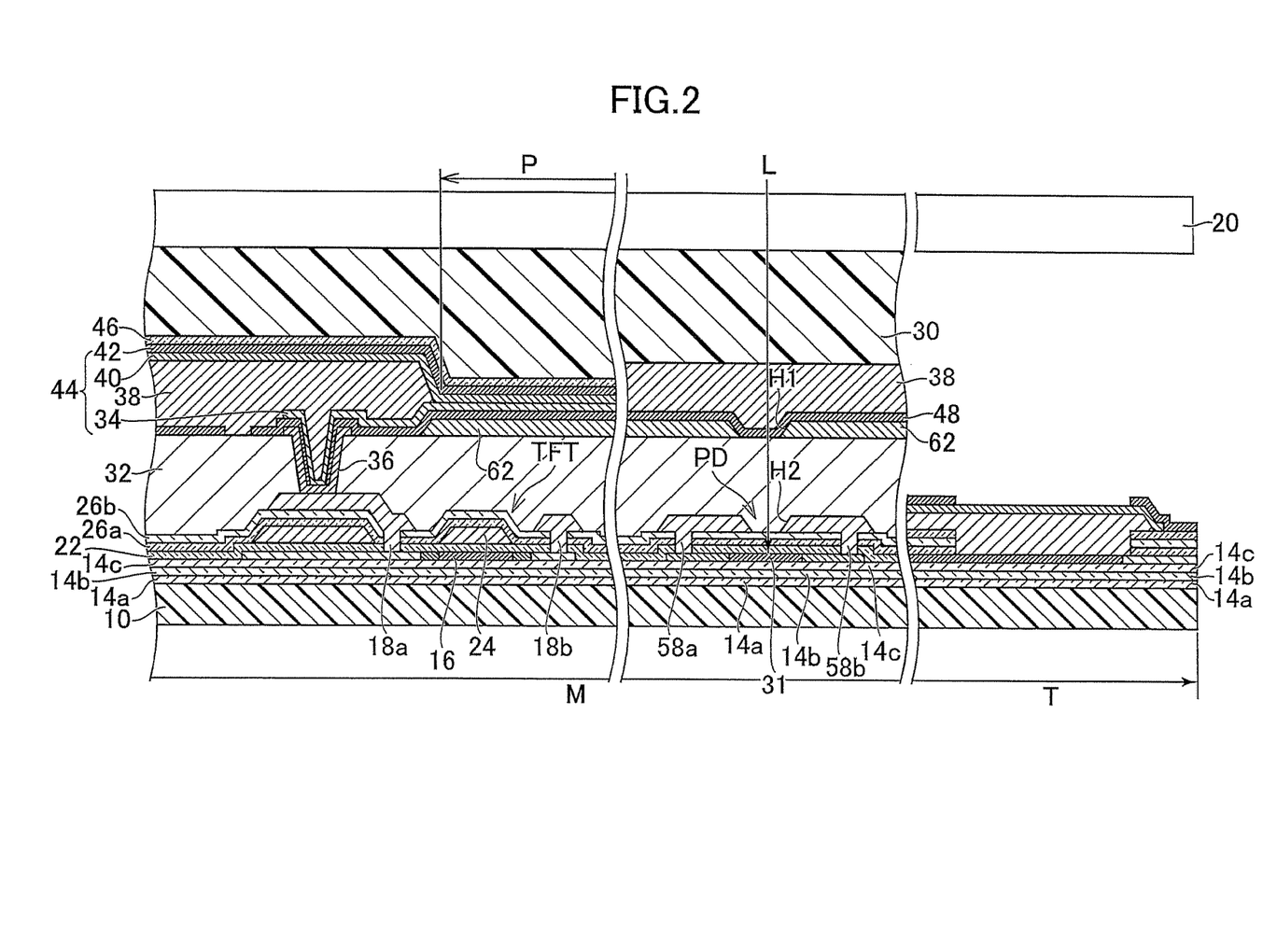
FIG. 2 is a sectional view of the sheet display according to the embodiment.

FIG. 2 is a sectional view of the sheet display according to the embodiment. First, with reference to FIG. 2, a sectional structure of regions in which the pixels P are arranged and regions in the vicinity thereof in the sheet display 100 will be described.

The first substrate 10 is made of resin or glass having the flexibility. For example, a film made of polyimide, polyethylene terephthalate, or the like may be used. The undercoat layers 14a, 14b, and 14c serving as a barrier against impurity contained by itself are formed on the first substrate 10. The undercoat layer 14a is made of a silicon oxide film, the undercoat layer 14b is made of a silicon nitride film, and the undercoat layer 14c is made of a silicon oxide film. The undercoat layer 14a is provided to improve adhesion between the first substrate 10 and the undercoat layer 14b. The undercoat layer 14b is provided on a first substrate 10 side in order to prevent diffusion of impurities into a semiconductor layer of a thin film transistor to be formed later. The undercoat layer 14c is provided to improve the adhesion of the undercoat layer 14b and a layer including the thin film transistor and to prevent diffusion of hydrogen into a semiconductor layer of the thin film transistor to be formed later from the undercoat layer 14b. These respective undercoat layers are an example and the undercoat layer 14a may be omitted in a case where the first substrate 10 is made of the glass.

A semiconductor layer 16 is formed on the undercoat layer 14c. A gate insulating film 22 is formed by covering the semiconductor layer 16. A gate electrode 24 is formed on the gate insulating film 22 and interlayer insulating films 26a and 26b are formed by covering the gate electrode 24. The interlayer insulating film 26a is made of, for example, a silicon nitride film, and the interlayer insulating film 26b is made of, for example, a silicon oxide film.

The metal wiring layers 18a and 18b are electrically connected to the semiconductor layer 16 through a contact hole passing through the gate insulating film 22 and the interlayer insulating films 26a and 26b. A drive thin film transistor (TFT) is configured with the semiconductor layer 16, the metal wiring layers 18a and 18b, and the gate electrode 24. The metal wiring layers 18a and 18b are source and drain electrodes of the thin film transistor TFT, and configured with, for example, titanium (Ti), aluminum (Al), and the like. A planarization layer 32 is provided on the thin film transistor TFT. The planarization layer 32 is provided so that a surface thereof on which at least a pixel electrode 34 is provided is flat. As a material of the planarization layer 32, an organic material such as photosensitive acrylic resin may be used. A plurality of pixel electrodes 34 (for example, anode) configured to correspond to each of a plurality of pixels P are provided on the planarization layer 32. The pixel electrode 34 is electrically connected to the metal wiring layer 18a on the semiconductor layer 16 through a contact hole 36 passing through the planarization layer 32. An insulating layer (bank) 38 partitioning the pixels P is formed on the pixel electrode 34.

A light emitting layer 40 is provided on the pixel electrode 34. The light emitting layer 40 is separately provided for each pixel electrode 34, and a part thereof is placed on the bank 38. The light emitting layer 40 emits light in a region provided in contact with the pixel electrode 34. As illustrated in FIG. 2, a region at which the light emitting layer 40 and the pixel electrode 34 are in contact with each other corresponds to the pixel P.

The light emitting layer 40 emits light as blue, red, and green corresponding to respective pixels P. The light emitting layer 40 may be formed by separately coating the light emitting layer 40 which emits light of each color, for example, by vapor deposition. However, the embodiment is not limited thereto. The light emitting layer 40 may be formed by coating using solvent dispersion. In addition, the color corresponding to each pixel is not limited thereto, and may be, for example, yellow, white, or the like. In addition, the light emitting layer 40 may be formed across the plurality of pixels P on the entire surface covering the display region M (see FIG. 1). That is, the light emitting layer 40 may be continuously formed on the insulating layer 38. In a case where the light emitting layer 40 is formed across the plurality of pixels P, a configuration in which white is emitted in the entire pixel P and a desired color wavelength portion is taken out through a color filter (not shown), may be implemented. The color filter may be provided in the second substrate 20. The color filter may be disposed across the pixel P and the photodiode PD. That is, the color filter may be disposed on the photodiode PD.

A counter electrode 42 (common electrode or cathode) is provided on the light emitting layer 40. By the pixel electrode 34 and the counter electrode 42 interposing the light emitting layer 40 and the light emitting layer 40 therebetween, an organic light emitting diode (OLED) element 44 (light emitting element layer) is configured. Each of the plurality of pixels P includes the OLED element 44. The light emitting layer 40 emits light by being interposed between the pixel electrode 34 and the counter electrode 42 and by controlling luminance by a current flowing between both electrodes. At least one layer of a hole transport layer and a hole injection layer (not shown) may be provided between the light emitting layer 40 and the pixel electrode 34. At least one layer of an electron transport layer and an electron injection layer (not shown) may be provided between the light emitting layer 40 and the counter electrode 42.

The OLED element 44 is covered with a sealing film 46 provided on the counter electrode 42 so as to be shielded from external moisture. The sealing film 46 includes at least one inorganic insulating layer made of silicon nitride (SiN) or the like and may have a laminated structure of a plurality of insulating layers. In addition, the second substrate 20 is provided on the sealing film 46 through a filling layer 30.

Furthermore, a sectional structure in a region on which the photodiode PD is disposed will be described with reference to FIG. 2. The same reference numerals are used for the same structure as the sectional structure in the region on which the above-described pixels P are arranged, and the description thereof is omitted.

The photodiode PD including a semiconductor layer 31 that is a light receiving element is provided on the undercoat layer 14c. The semiconductor layer 31 is made of polysilicon or the like. The gate insulating film 22 and the interlayer insulating films 26a and 26b made of silicon oxide are provided on the semiconductor layer 31. In addition, metal wiring layers 58a and 58b are provided on the same layer as the metal wiring layers 18a and 18b. The metal wiring layers 58a and 58b are electrically connected to the semiconductor layer 31 through the contact hole passing through the gate insulating film 22 and the interlayer insulating films 26a and 26b. For example, the metal wiring layers 58a and 58b are made of titanium (Ti), aluminum (Al), or the like. In addition, the metal wiring layer 58a and the metal wiring layer 58b are arranged on the same layer and provided by separating from each other. A hole H2 passing from an upper layer side to a lower layer side which is adjacent to the metal wiring layer 58a and the metal wiring layer 58b is formed.

A planarization film 32 is provided on the metal wiring layers 58a and 58b. A metal wiring layer (reflective metal layer) 62 is provided on the planarization film 32. For example, the metal wiring layer 62 is made of a metal such as molybdenum (Mo) or aluminum (Al), and reflects the light from the light emitting layer 40 toward a display surface side. A hole H1 passing from the upper layer side to the lower layer side is formed in the metal wiring layer 62. The hole H1 is provided to overlap with the hole 112. A part of the external light as incident light L is incident on the semiconductor layer 31 through the hole H1 and the hole H2. The sheet display 100 converts the incident light L incident on the semiconductor layer 31 into an electric signal such that the external subject is obtained as the image data and the obtained result is displayed on the display region M.

In addition, a silicon nitride film 48 is provided on the metal wiring layer 62. Then, the second substrate 20 is provided on the silicon nitride film 48 through the filling layer 30.

Next, an overview of a circuit configuration of the embodiment will be described with reference to FIG. 3 to FIG. 5.

Figure 3:
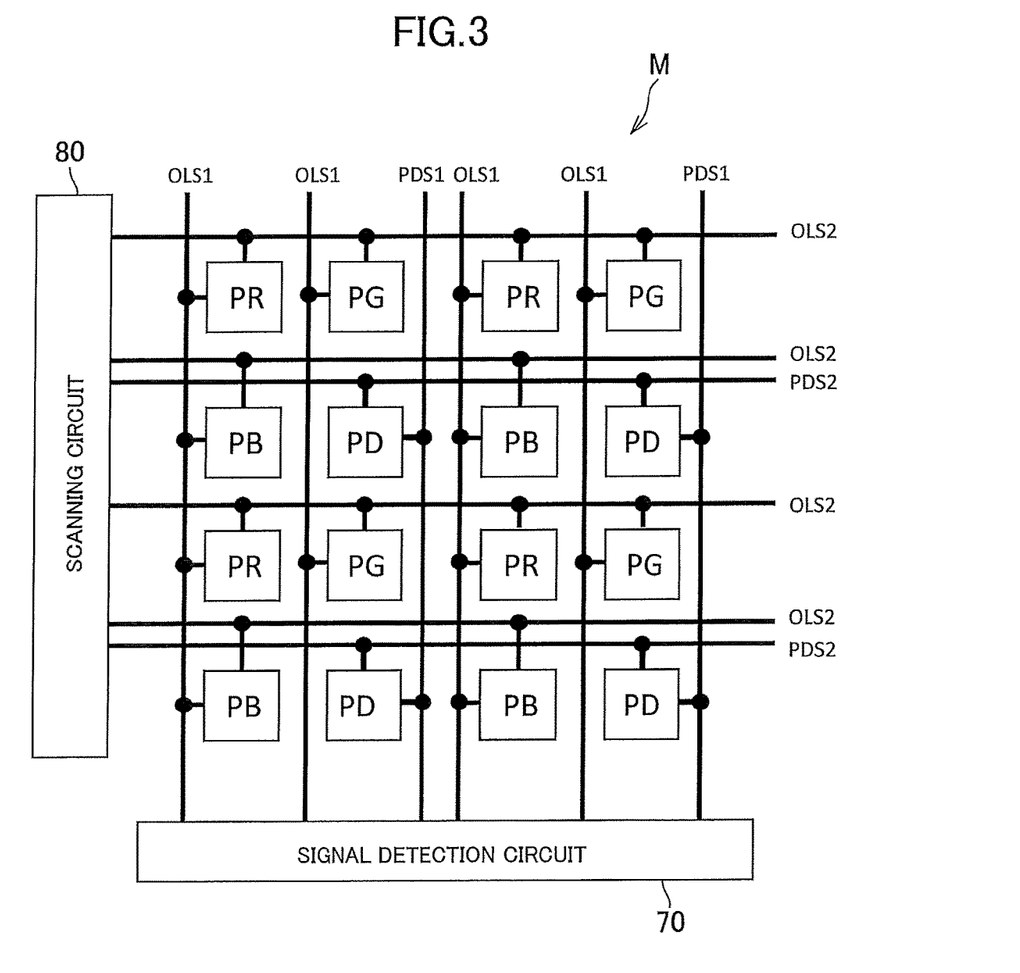
FIG. 3 is a diagram illustrating an overview of an arrangement of pixels and photodiodes and wiring.

FIG. 3 is a diagram illustrating an overview of an arrangement of pixels and photodiodes and wiring. As illustrated in FIG. 3, the plurality of pixels P (PR, PG, and PB) arranged in the matrix and the photodiodes PD arranged in a region not overlapped with the pixel P in the matrix are provided on the display region M. In addition, a signal detection circuit 70 and a scanning circuit 80 are provided in the vicinity of the display region M.

The pixel P is connected to a signal line OLS1 extending from the signal detection circuit 70, and to a scanning line OLS2 extending in a direction intersecting a direction along which the signal line OLS1 is extending, from the scanning circuit 80. The photodiode PD is connected to a signal line PDS1 extending from the signal detection circuit 70 and to a scanning line PDS2 extending in a direction along which the signal line PDS1 is extending, from the scanning circuit 80.

Figure 4:
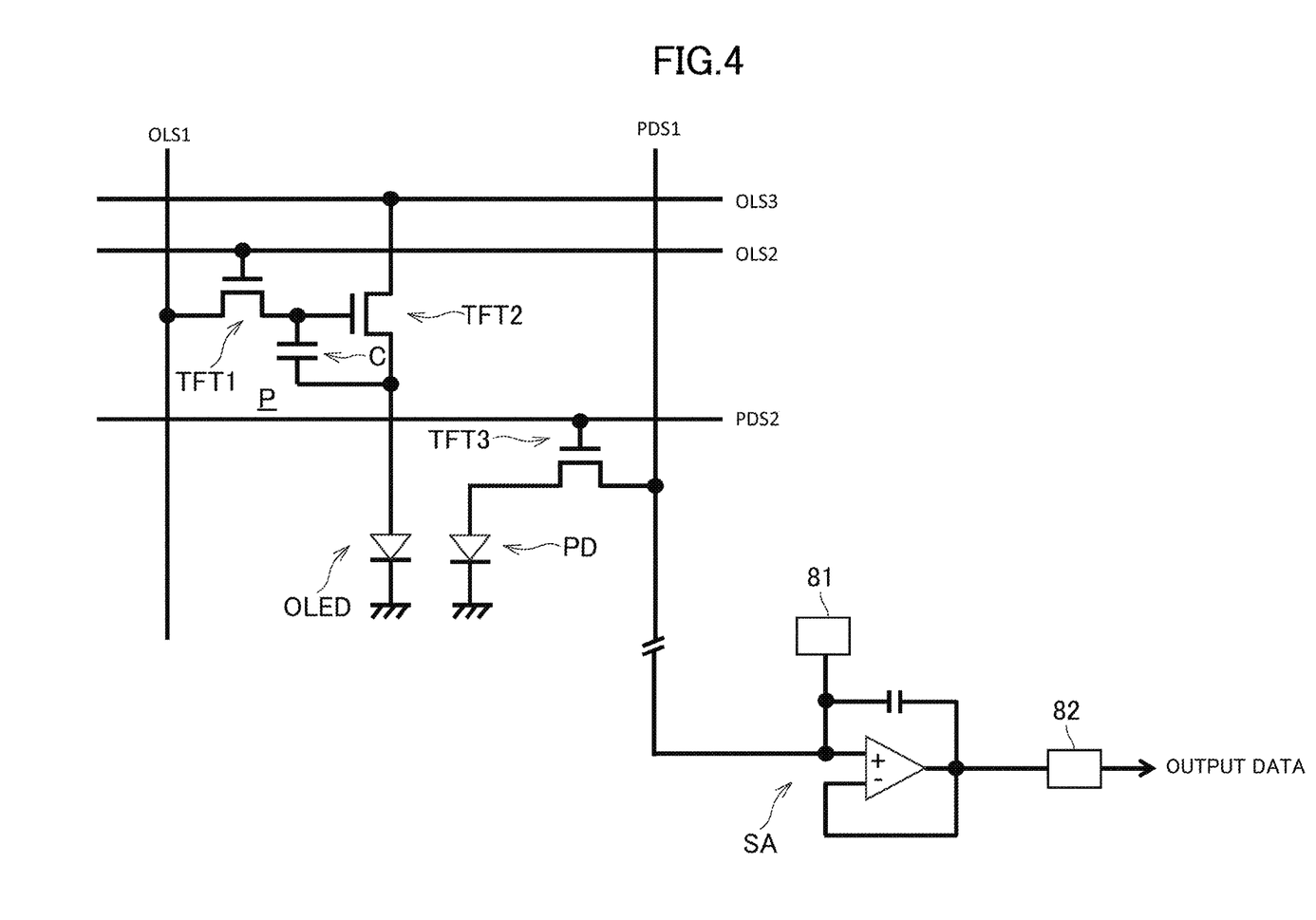
FIG. 4 is a circuit diagram illustrating an example of a circuit configuring one pixel and a circuit configuring one photodiode.

FIG. 4 is a circuit diagram illustrating an example of a circuit configuring one pixel and a circuit configuring one photodiode. The pixel P includes a sampling thin film transistor TFT1, a driving thin film transistor TFT2 (corresponding to TFT illustrated in FIG. 2), and an OLED element.

The sampling thin film transistor TFT1 is disposed in the vicinity of an intersection between the scanning line OLS2 and the signal line OLS1. A gate of the sampling thin film transistor TFT1 is connected to the scanning line OLS2, one of a source or a drain is connected to the signal line OLS1, and the other thereof is connected to a gate of the driving thin film transistor TFT2. The sampling thin film transistor TFT1 samples a signal potential supplied from the signal line OLS1 and holds the sampled signal potential in a storage capacitor C.

One of a source or a drain of the driving thin film transistor TFT2 is connected to the OLED element and the other is connected to a power source line OLS3 extending in the same direction as that of the scanning line OLS2. The driving thin film transistor TFT2 receives a current supplied from the power source line OLS3, and a driving current flows in the OLED element according to the signal potential held in the storage capacitor C.

The photodiode PD includes the thin film transistor TFT3. A gate of the thin film transistor TFT3 is connected to the scanning line PDS2, one of a source or drain is connected to the signal line PDS1, and the other thereof is connected to a photodiode element. A cathode of the OLED element and a cathode of the photodiode element are common electrodes. Therefore, it is possible to miniaturize the pixel P and the photodiode PD. In addition, the signal line PDS1 is connected to a negative feedback type sense amplifier SA. The sense amplifier SA is connected to a reset voltage application circuit 81 and an output voltage analog to digital (AD) converting circuit 82. A voltage converted in the output voltage analog to digital AD converting circuit 82 is output as output data (image data).

Although it is not specifically illustrated, in addition to the thin film transistors TFT1 to TFT3, another transistor for controlling the OLED element, a transistor for initializing charges stored in the photodiode PD, and the like may be implemented.

Figure 5:
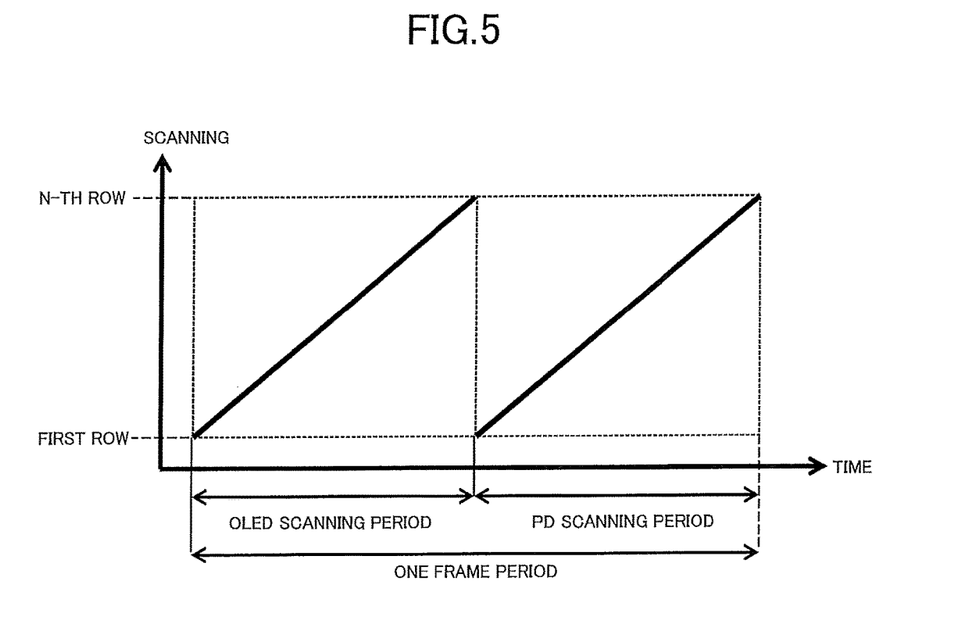
FIG. 5 is a timing chart illustrating a drive timing.

FIG. 5 is a timing chart illustrating a drive timing. An OLED scanning period is allocated in the first half of one frame period and a PD scanning period is allocated in the second half thereof. Scanning from the first row to the n-th row (n is integer of two or more) is performed within the first half period and the second half period. By setting a period during which the OLED scanning period and the PD scanning period are not overlapped in this manner, it is difficult for noise to be detected in signal detection in the photodiode PD and it is possible to improve detection sensitivity.

Figure 6:
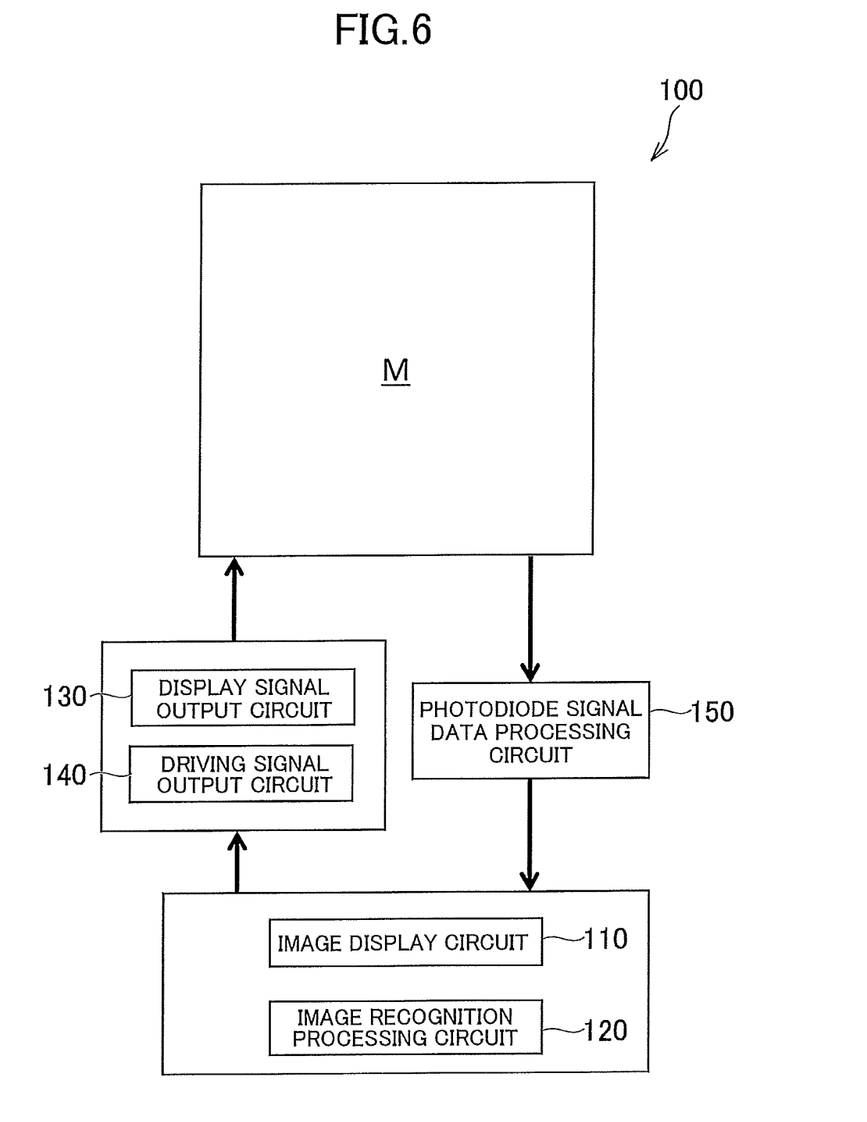
FIG. 6 is a conceptual diagram illustrating a configuration of a signal processing circuit of the embodiment.

FIG. 6 is a conceptual diagram illustrating a configuration of a signal processing circuit of the embodiment. The sheet display 100 includes an image display circuit 110, an image recognition processing circuit 120, a display signal output circuit 130, a driving signal output circuit 140, and a photodiode signal data processing circuit 150. The image display circuit 110 and the image recognition processing circuit 120 input a display image and a display timing to the display signal output circuit 130 and the driving signal output circuit 140. The display signal output circuit 130 and the driving signal output circuit 140 input a display signal and a driving signal to the display region M. Image display in the display region M is performed based on the display signal and a driving signal which are input. In addition, incident light is taken from the outside in the display region M. An incident light signal corresponding to the incident light is input to the photodiode signal data processing circuit 150. The photodiode signal data processing circuit 150 converts the incident light signal into predetermined luminance gradation data, and outputs the converted data to the image display circuit 110 and the image recognition processing circuit 120. The image display circuit 110 and the image recognition processing circuit 120 includes a data signal processing function reconfiguring the image data of a subject by using the luminance gradation data based on the incident light.

Figure 7:
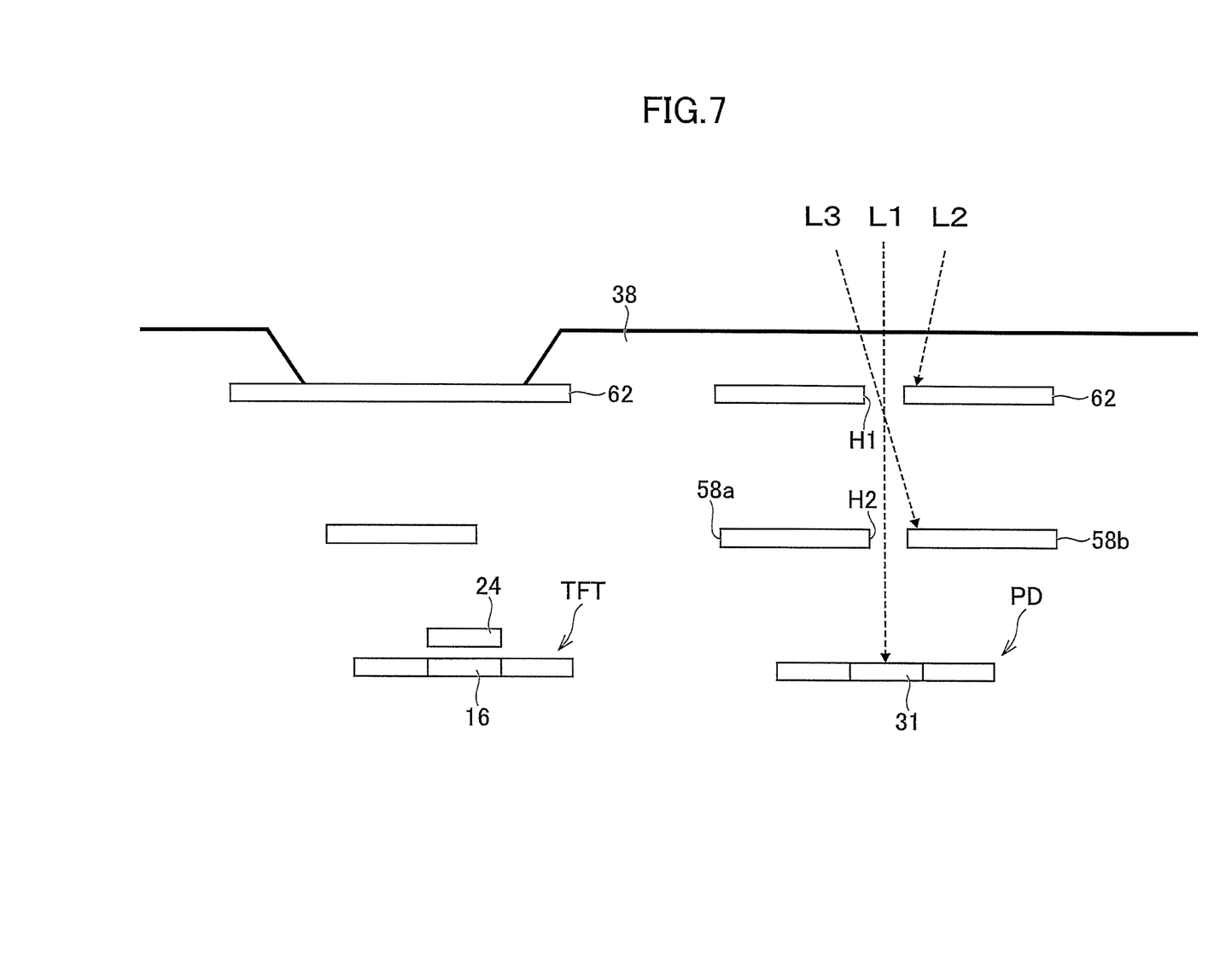
FIG. 7 is a schematic diagram illustrating a configuration example in the vicinity of the photodiode in the embodiment.

Processing of the external light in the display region M will be described with reference to FIG. 7. FIG. 7 is a schematic diagram illustrating an example of a configuration in the vicinity of the photodiode in the embodiment. As described above, the sheet display 100 recognizes the external subject (for example, face of user) according to an output based on the incident light L incident on the semiconductor layer 31, and performs image display of the subject on the display region M. The sheet display 100 does not include a function such as focusing without mounting an imaging unit including a lens or the like including an optical system. Accordingly, in the embodiment, in order to obtain an external image including a long distance as the image data without mounting the imaging unit such as the lens, a study on a structure devising to restrict an incident angle of the external light is devised. Then, as will be described below, the obtained image data is reconstructed and the reconstructed image data is displayed on the display region M.

The semiconductor layer 31 configuring the photodiode PD receives a part of the external light as the incident light L. In the embodiment, as illustrated in FIG. 7, the incident light L1 reaches the semiconductor layer 31 through the hole H1 of the metal wiring layer 62 and the hole H2 formed adjacent to the metal wiring layer 58a and the metal wiring layer 58b. Here, the hole H1 and the hole H2 may be a hole shape, a slit shape, or a combination thereof. For example, one may be the hole shape, the other may be the slit shape, or the hole may be a slit shape not parallel to each other. What is essential is that the hole H1 and the hole H2 are formed so as to suppress the spread of the incident angle of light to the semiconductor layer 31 in a direction perpendicular to an incident axis of the incident light L1.

The hole H1, the hole H2, and the semiconductor layer 31 are arranged by being overlapped with each other. The hole H1 and the hole H2 limit the incident angle of the external light in the normal direction to the display surface. That is, the hole H1 and the hole H2 guide only the external light (incident light LI) traveling in the normal direction to the display surface to the semiconductor layer 31, and are arranged so as to prevent the external light (incident lights L2 and L3) traveling in a tilted direction to the normal direction from entering the semiconductor layer 31. In this manner, in the embodiment, only the external light incident on the display surface of the display region M at an angle of approximately 90 degrees reaches the semiconductor layer 31.

In the embodiment, open widths of the hole H1 and the hole H2 are approximately the same, but are not limited thereto. At least parts of the hole H1 and the hole H2 may be arranged by being overlapped with each other. It is preferable that the open widths of the hole H1 and the hole H2 are approximately 1 μm to 100 μm. It is preferable that the hole H1 and the hole H2 are provided by being separated from each other approximately by 0.5 μm to 1 μm.

Figure 8:
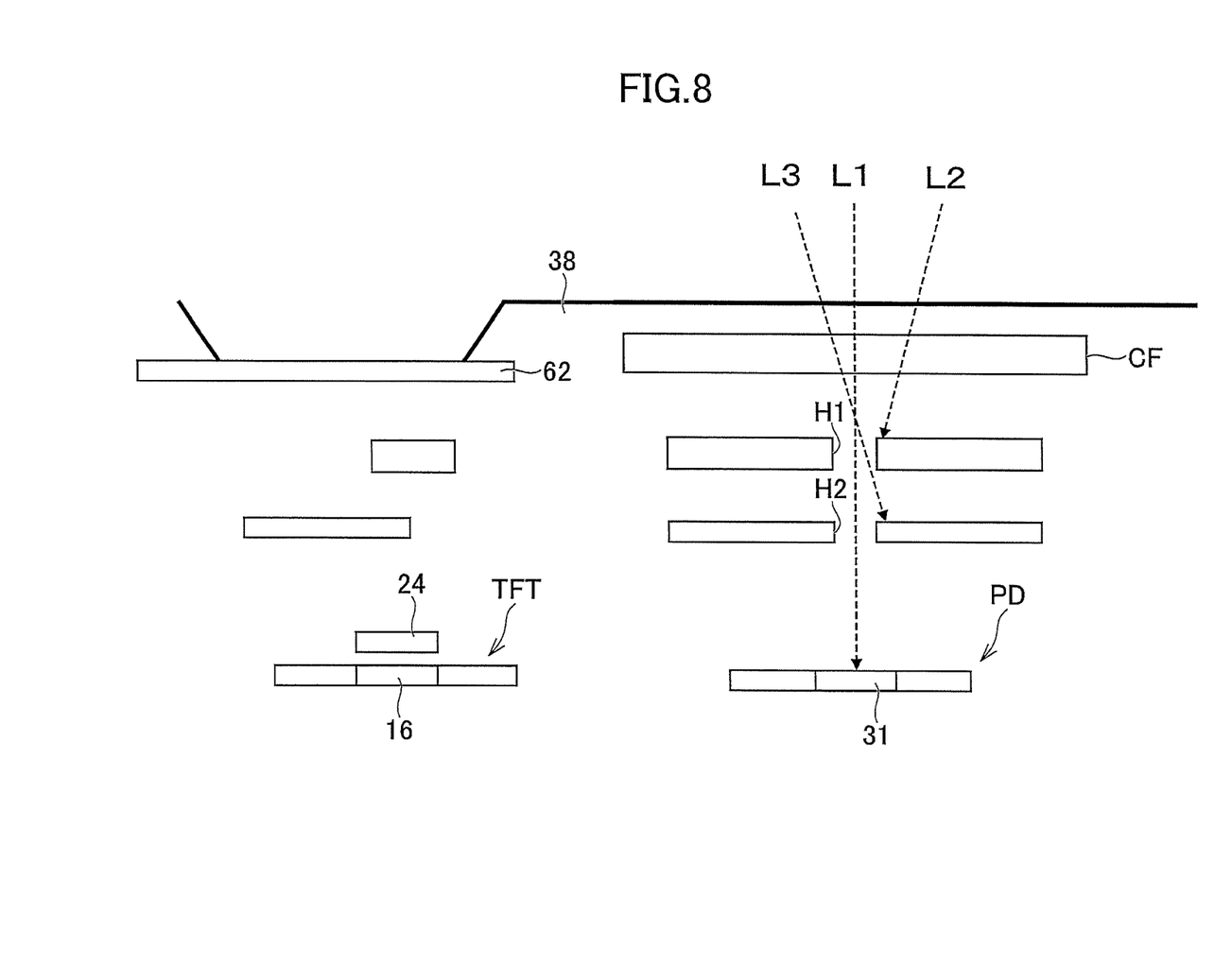
FIG. 8 is a schematic diagram illustrating a configuration example in the vicinity of the photodiode in the embodiment.

As illustrated in FIGS. 2 and 7, the holes for limiting the incident angle of the external light incident on the semiconductor layer 31 are not limited to those formed in the metal wiring layer 62. For example, as illustrated in FIG. 8, a built-in color filter CF for imaging may be provided in a region below a bank 38 and not overlapping with the pixel P, and a hole H1 may be formed in any of the metal wiring layers below the region. In a case where the built-in color filter CF is provided, since distance between the color filter and the semiconductor layer 31 as the light receiving element can be shortened rather than the color filter provided on the second substrate 20, it is possible to cause the external light having passed through the color filter to reach the semiconductor layer 31 with high accuracy.

In the embodiment, a configuration in which two holes are formed by being overlapped with each other is implemented. However, three or more layers may be formed so as to overlap each other on any layer of a laminated structure on a substrate 10. As the number of holes which are overlapped with each other is great, it becomes easier to more restrict the incident angle of the external light incident on the display surface through the holes.

By using FIG. 1 to FIG. 8, although a configuration of the sheet display is described in the embodiment, a photodiode array may be provided on a layer different from a layer in which the TFT and the OLED are formed. For example, a third substrate (not shown) on which the photodiode array is provided differently from the first substrate 10 in which the sheet display is formed may be prepared by attaching it to a rear surface of the first substrate 10. In this case, the hole for limiting the incident angle of the external light may be used in the metal wiring layer of a first substrate 10 side, or may also be provided in the metal wiring layer of a third substrate side.

Figure 9:
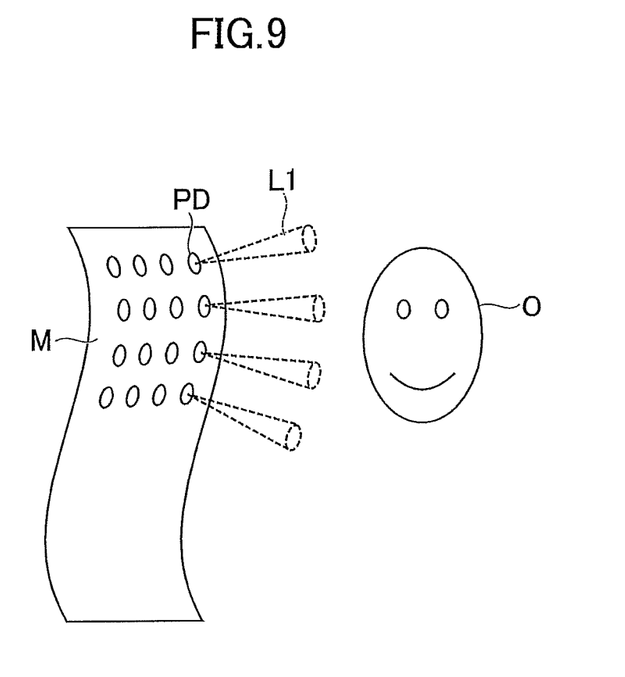
FIG. 9 is a diagram illustrating a sheet display in which the display surface for receiving external light is curved to be convex, and a subject.
Figure 10A:
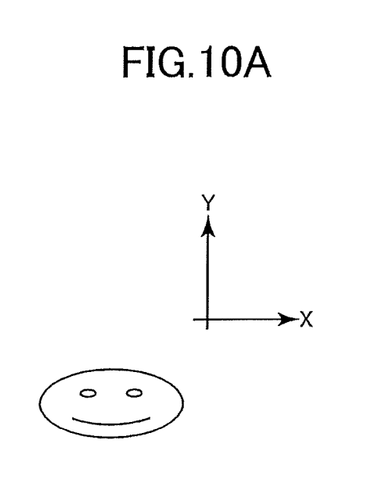
FIG. 10A is a diagram illustrating image data of the subject before reconfiguration.
Figure 10B:
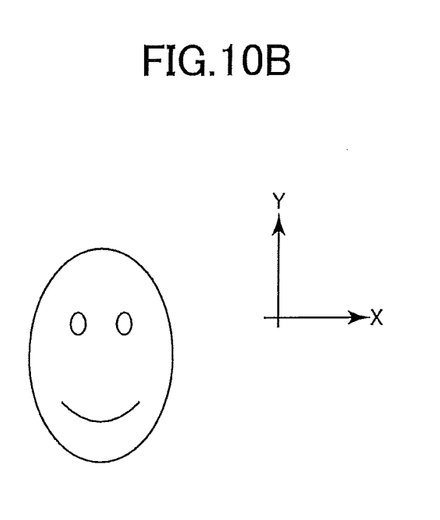
FIG. 10B is a diagram illustrating image data of the subject after reconfiguration.

The reception of the external light and the reconstruction of the image data in the embodiment will be described with reference to FIG. 9 to FIG. 12B. FIG. 9 is a diagram illustrating the sheet display curved such that the display surface for receiving external light is curved to be convex and the subject. FIG. 10A illustrates the image data of the subject before reconfiguration, and FIG. 10B illustrates the image data of the subject after reconfiguration.

Figure 11:
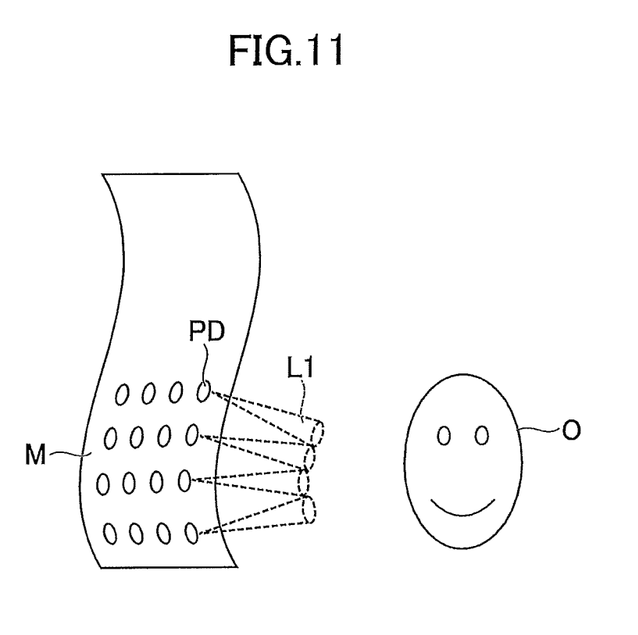
FIG. 11 is a diagram illustrating the sheet display in which the display surface for receiving the external light is curved to be concave, and the subject.
Figure 12A:
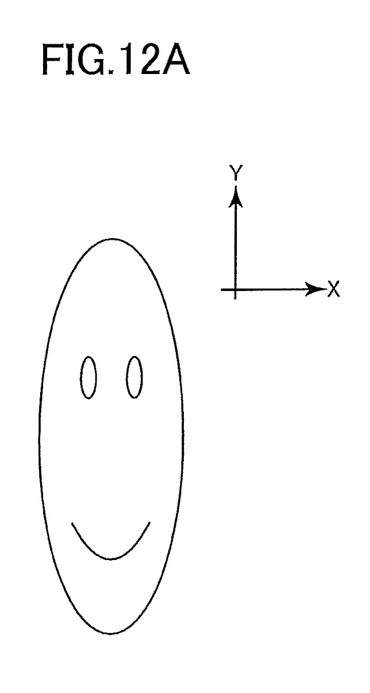
FIG. 12A is a diagram illustrating the image data of the subject before reconfiguration.
Figure 12B:
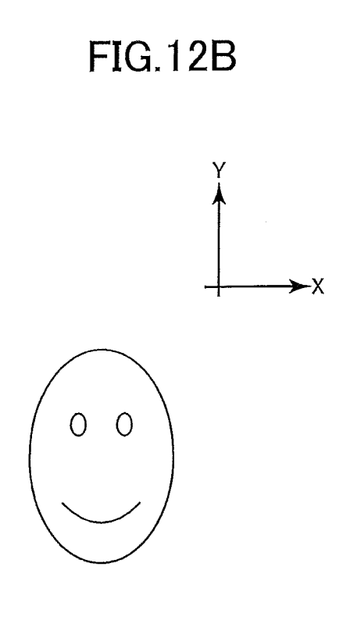
FIG. 12B is a diagram illustrating the image data of the subject after reconfiguration.

FIG. 11 is a diagram illustrating the sheet display curved such that the display surface for receiving the external light is curved to be concave and the subject. FIG. 12A illustrates the image data of the subject before reconfiguration, and FIG. 12B illustrates the image data of the subject after reconfiguration.

In the sheet display 100, the display surface of the display region M can be curved. In the display region M, a plurality of photodiodes PD are arranged in the matrix. The sheet display 100 receives the external light in the photodiode PD of the display region M, and obtains an external subject O as the image data. As described with reference to FIG. 7, a configuration in which the sheet display 100 receives only the external light traveling in the normal direction to the display surface by the photodiode PD, is implemented. This is the same as a case where the display surface of the display region M of the sheet display 100 is curved. That is, as illustrated in FIG. 9, even in a case where the display surface of the display region M of the sheet display 100 is curved to be convex, only the external light (incident light L1) traveling in the normal direction to the display surface reaches the photodiode PD.

Here, in a state where the display surface is curved, in a case where the photodiode PD receives the external light, the image data of the subject O is obtained in a state where the subject O is expanded or contracted according to the direction and degree of the curve. That is, the image data in a state where a shape of the subject O is distorted is obtained. Specifically, as illustrated in FIG. 10A, in the image data of the subject O obtained in a state where the display surface is convex, the ratio of a length in a Y direction to an X direction is smaller than that of an actual subject O. In addition, as illustrated in FIG. 12A, in the image data of the subject O obtained in a state where the display surface is concave, the ratio of the length in the Y direction to the X direction is greater than that of the actual subject O.

As described above with reference to FIG. 6, the image display circuit 110 and the image recognition processing circuit 120 have the data signal processing function reconfiguring the image data obtained based on the incident light L1. Specifically, the image data illustrated in FIG. 10A and FIG. 12A is corrected such that the ratio of the length in the Y direction to the X direction becomes the same as that of the actual subject O as illustrated in FIG. 10B and FIG. 12B. This correction may be performed by using an algorithm that the obtained image data of the subject O is compared with a template of the shape of the subject O stored in advance, or the like.

Figure 13:
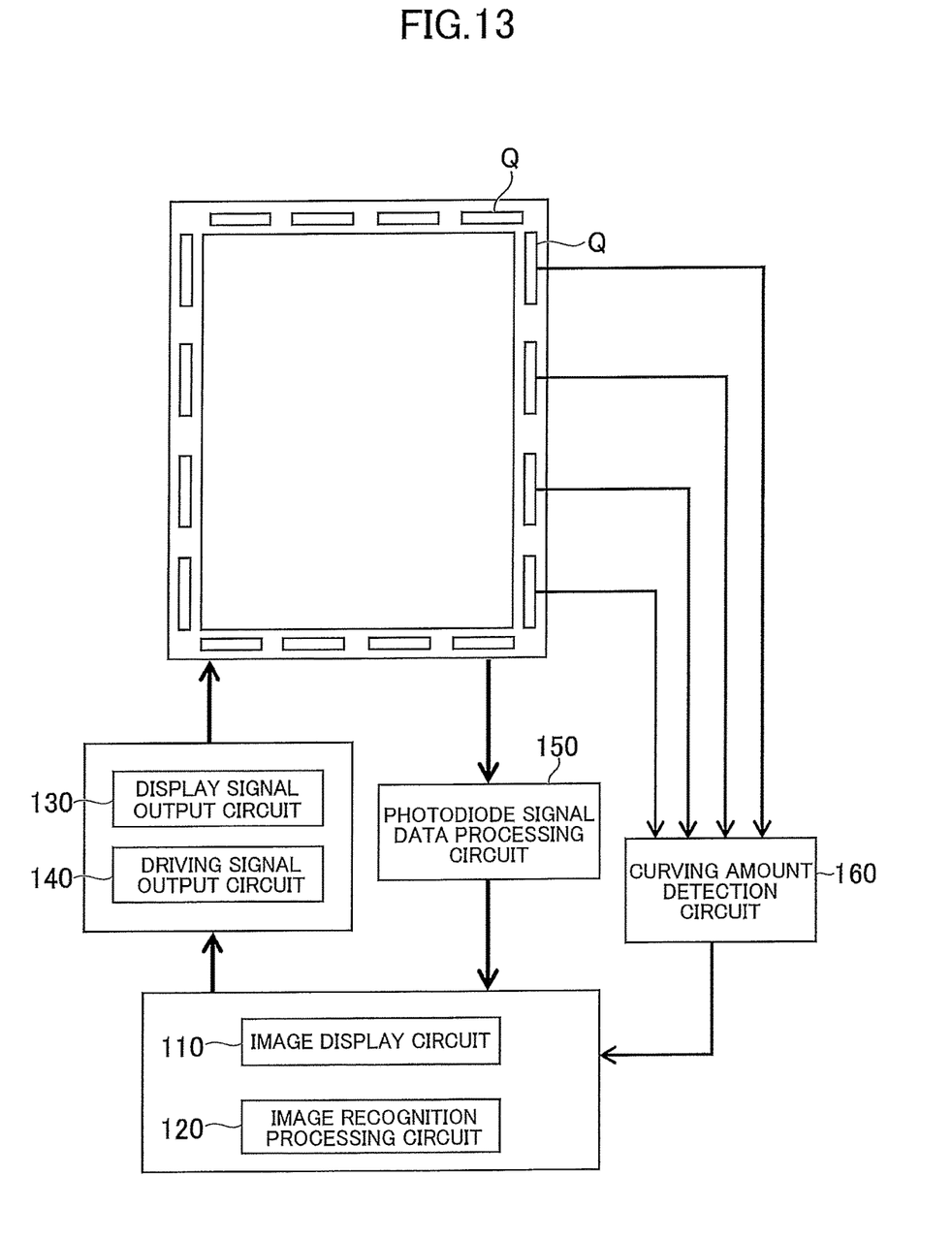
FIG. 13 is a conceptual diagram illustrating a configuration of a signal processing circuit of a modification example of the embodiment.

For example, as illustrated in FIG. 13, in order to perform the reconstruction of the image, a curving amount detection circuit 160 may be further provided. FIG. 13 is a conceptual diagram illustrating a configuration of a signal processing circuit of a modification example of the embodiment. In the modification example, a plurality of piezoelectric elements Q used for detecting a curving amount are arranged in the vicinity of the display region M. For example, the plurality of the piezoelectric elements Q are provided in parallel with the frame region N illustrated in FIG. 1.

The curving amount detection circuit 160 detects the curving amount of the display region M based on a load applied to the piezoelectric element Q on a curving axis when the display region M is curved. In addition, the curving amount detection circuit 160 detects a curving direction of the display region M based on a positive or negative voltage generated from the piezoelectric element Q in addition to the detection of the curving amount. That is, whether the display surface of the display region M is curved to be concave or to be convex is detected.

The curving amount detection circuit 160 outputs a curve signal as the curving amount of the display region M to the image display circuit 110 and the image recognition processing circuit 120. The image display circuit 110 and the image recognition processing circuit 120 reconstruct the image data by using the curve signal. As described above, in the configuration of the modification example, since the image data is reconstructed according to the curving amount of the display region M, the accuracy of reproducibility of the subject O after the reconfiguration is improved. In addition, by including the curving amount detection circuit 160, it is possible to simplify data processing in an image display circuit and an image recognition processing circuit.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device comprising:
a display region including a plurality of pixels arranged in a matrix and photodiodes arranged on regions not overlapped with the plurality of pixels in the matrix; and
a laminated structure including at least a metal layer and provided on the photodiode, wherein
each of the plurality of pixels includes a transistor including a first semiconductor layer,
each of the photodiodes includes a second semiconductor layer,
in at least two layers including the metal layer in the laminated structure, slits or holes are provided such that external light is incident on the photodiode,
a slit or a hole formed on one of the at least two layers and a slit or a hole formed on another of the at least two layers are provided by being overlapped with each other;
both of the at least two layers are over the first semiconductor layer and the second semiconductor layer, and
the slit or the hole formed on the one of the at least two layers and the slit or the hole formed on the another of the at least two layers overlap with the second semiconductor layer.
2. The display device according to claim 1,
wherein the at least two layers are layers provided by being separated from each other.
3. The display device according to claim 1,
wherein the laminated structure includes a light emitting element layer including a lower electrode, a light emitting layer provided on the lower electrode, and an upper electrode provided on the light emitting layer, and a reflective metal layer provided under the lower electrode, and
the slit or the hole formed on the one of the at least two layers is formed in the reflective metal layer.
4. The display device according to claim 3, wherein
the transistor includes a source electrode and a chain electrode, and
the another of the at least two layers is the same layer as the source electrode and the drain electrode.
5. The display device according to claim 1,
wherein the metal layer includes a first electrode or a second electrode of the photodiode, and
the slit or the hole formed on the one of the at least two layers is formed adjacent to the first electrode or the second electrode.
6. The display device according to claim 1, further comprising:
a plurality of piezoelectric elements arranged in the vicinity of the display region, and
a curving amount detection circuit for detecting a curving amount of the display region based on a load applied to the piezoelectric elements on a curving axis when the display region is curved.
7. The display device according to claim 1, wherein
each of the first semiconductor layer and the second semiconductor layer is in the same layer.

* * * * *